United States Patent
Yamada

(10) Patent No.: US 8,582,013 B2
(45) Date of Patent: Nov. 12, 2013

(54) REFRACTIVE INDEX DISTRIBUTED OPTICAL ELEMENT AND IMAGE SENSOR INCLUDING THE REFRACTIVE INDEX DISTRIBUTED OPTICAL ELEMENT

(75) Inventor: Daisuke Yamada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 679 days.

(21) Appl. No.: 12/750,398

(22) Filed: Mar. 30, 2010

(65) Prior Publication Data
US 2010/0253828 A1    Oct. 7, 2010

(30) Foreign Application Priority Data
Apr. 3, 2009    (JP) .................................. 2009-090664

(51) Int. Cl.
*H04N 5/225*    (2006.01)
*G02B 27/30*    (2006.01)
*H01Q 15/02*    (2006.01)

(52) U.S. Cl.
USPC ..................... 348/340; 359/641; 343/911 R

(58) Field of Classification Search
USPC ................ 385/24, 131; 359/361, 793, 654; 348/340; 343/911 R
See application file for complete search history.

(56) References Cited

U.S. PATENT DOCUMENTS 6,549,254 B1*  4/2003  Grupp et al. ................. 349/115
2007/0201805 A1*  8/2007  Hamada ...................... 385/131
2009/0033586 A1*  2/2009  Sanada ..................... 343/911 R

FOREIGN PATENT DOCUMENTS

JP    H06-180444 A    6/1994
JP    H10-229180 A    8/1998

* cited by examiner

*Primary Examiner* — Roberto Velez
*Assistant Examiner* — Stephen Coleman
(74) *Attorney, Agent, or Firm* — Canon U.S.A., Inc. IP Division

(57) ABSTRACT

A refractive index distributed optical element having a refractive index varying within a plane, including a positive refractive index distributed portion having a positive refractive index varying within the plane and a negative refractive index distributed portion having a negative refractive index varying within the plane. The absolute values of the refractive indexes of the positive refractive index distributed portion and the negative refractive index distributed portion decrease toward a region between the positive refractive index distributed portion and the negative refractive index distributed portion.

9 Claims, 7 Drawing Sheets

INCIDENT ANGLE 20°

INCIDENT ANGLE 14°

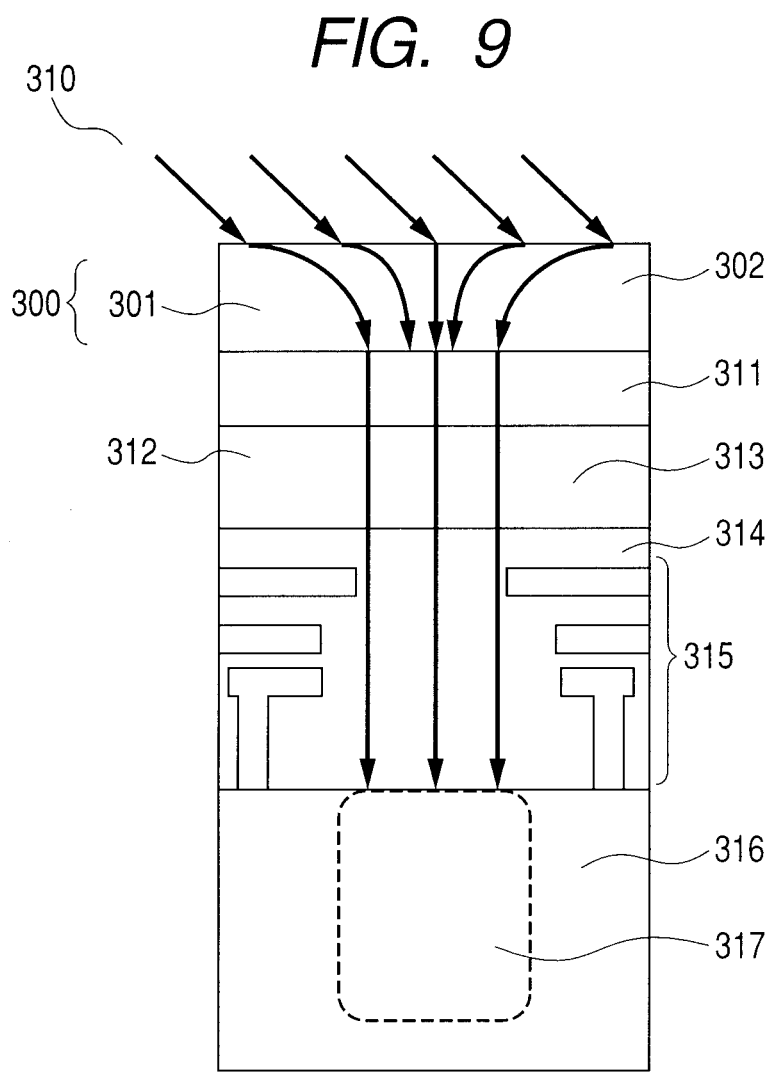

FIG. 10A1 PRIOR ART
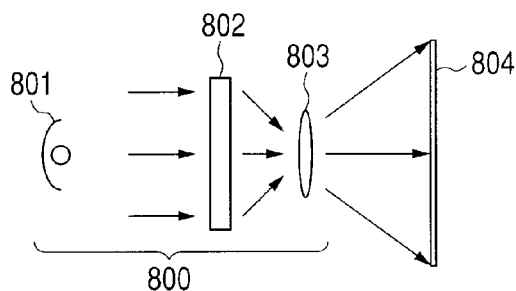
FIG. 10A2 PRIOR ART
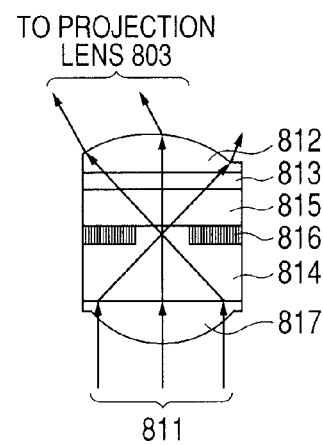
FIG. 10B1 PRIOR ART
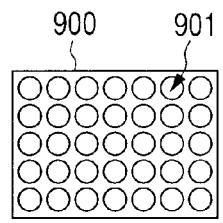
FIG. 10B2 PRIOR ART
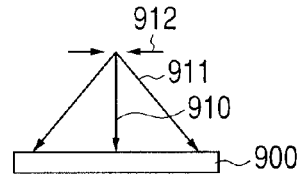
FIG. 10B3 PRIOR ART
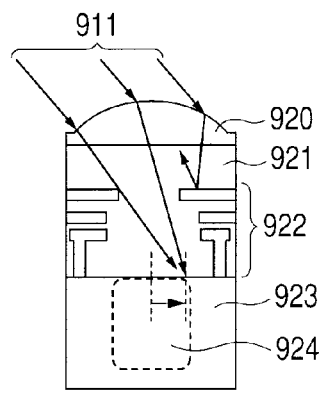
FIG. 10B4 PRIOR ART
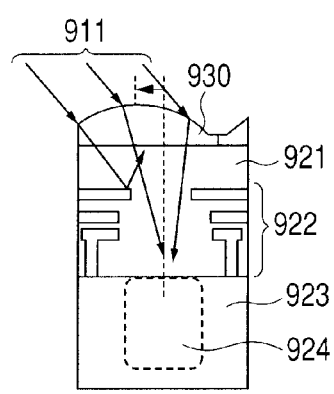

REFRACTIVE INDEX DISTRIBUTED OPTICAL ELEMENT AND IMAGE SENSOR INCLUDING THE REFRACTIVE INDEX DISTRIBUTED OPTICAL ELEMENT

BACKGROUND OF THE INVENTION

1. Field of the Invention

The present invention relates to a refractive index distributed optical element and an image sensor including the refractive index distributed optical element, and more particularly, to a refractive index distributed element having positive and negative refractive indexes varied within a plane and an image sensor including the refractive index distributed optical element.

2. Description of the Related Art

Up to now, in a projection display device such as a projector or a light receiving device such as an image sensor, an element that controls light direction and light spread is required for apparently improving the aperture ratio of pixels to convert the light direction.

First, a general configuration in the prior art in which the element that controls the light direction and the light spread is applied to a projector is described with reference to FIGS. 10A1 and 10A2.

In FIG. 10A1, a projector 800 includes a light source 801, a spatial light modulator 802, and a projection lens 803.

Light exiting from the projection lens 803 is projected on a screen 804 to display an image.

In the spatial light modulator 802, multiple pixels that modulate transmittance are arranged two-dimensionally.

FIG. 10A2 illustrates a cross-sectional view of peripheral portions of the pixels of the spatial light modulator 802.

The spatial light modulator 802 includes a microlens 812 on the exiting side, substrates 813 and 814, a liquid crystal layer 815, black matrixes 816, and a microlens 817 on the incident side.

Incident light 811 is deflected by the microlens 812 through an aperture between the black matrixes 816, and exits in a direction of the projection lens 803. The aperture ratio of the pixels is apparently improved by the microlenses 812 and 817 to convert the direction of light.

In the prior art, a configuration in which incident light is deflected by the aid of the decentering microlens 812 in order to deflect the light in the direction of the projection lens 803 as illustrated in FIGS. 10B1 to 10B4 has been proposed (for example, refer to Japanese Patent Application Laid-Open No. H06-180444).

A configuration in which light is deflected by the aid of a prism has also been proposed (not shown).

Next, a general configuration in the prior art in which the element that controls the light direction and the light spread are applied to an image sensor is described with reference to FIGS. 10B1 to 10B4.

FIG. 10B1 illustrates a general configuration of an area sensor 900 in which multiple image sensors are two-dimensionally arranged. Specifically, the area sensor 900 includes image sensors 901 such as CCDs or CMOS elements, which are two-dimensionally arranged.

FIG. 10B2 illustrates a lateral view of the area sensor 900 from in which light enters to the respective image sensors of the area sensor 900 from an exit pupil 912 of a camera lens.

Incident light 910 is light entering into central portions of the pixels of the area sensor 900, and incident light 911 is light entering into peripheral portions of the pixels of the area sensor 900.

The incident light 910 enters perpendicularly to a plane of the two-dimensionally arranged area sensor 900, and the incident light 911 enters obliquely to the plane of the two-dimensionally arranged area sensor 900.

FIG. 10B3 illustrates a cross-sectional view of the image sensors of the peripheral portions of the pixels of the area sensor 900 to which the incident light 911 enters.

The image sensors includes a microlens 920, an interlayer insulating film 921, a wiring layer or a light shielding film 922, and a semiconductor region 923 including an photoelectric conversion portion 924.

With the above-mentioned configuration, there arise such problems that the incident light 911 is not focused on the center of the photoelectric conversion portion 924, and the incident light 911 is scattered by the wiring layer 922 provided midway, and hence the incident light 911 may not be efficiently condensed on the photoelectric conversion portion 924.

For that reason, in the prior art, as illustrated in FIG. 10B4, the aperture ratio of the pixels is apparently improved to convert the light direction by the microlens 930.

That is, a configuration in which the position of the microlens 930 is shifted from the center of the photoelectric conversion portion 924 to the side of the central portions of the pixels so that the focal position is shifted to the photoelectric conversion portion 924 has been proposed (for example, refer to Japanese Patent Application Laid-Open No. H10-229180).

Further, a configuration in which a prism is used to deflect the oblique incident light to the photoelectric conversion portion side has been proposed.

However, the spatial light modulator and the image sensor in the above-mentioned prior art suffer from the following problems.

First, the spatial light modulator 802 illustrated in FIGS. 10A1 and 10A2 is described.

The incident light may be deflected to the projection lens 803 side by the aid of a decentering lens or a prism. However, the configuration of the spatial light modulator of the prior art illustrated in FIGS. 10A1 and 10A2 suffers from such a problem that alignment of the decentering lens or the like with the aperture is difficult.

The image sensors illustrated in FIGS. 10B1 to 10B4 are described below.

The incident light may be deflected to the photoelectric conversion portion side by the aid of the microlens 930. However, in the configuration of the image sensors illustrated in FIGS. 10B1 to 10B4, a beam diameter exited from the microlens 930 may not be converted into a narrower diameter. For that reason, the incident light hits on the wiring layer or the light shielding film 922 and is scattered.

Even if a prism is inserted, and the incident light is deflected to the photoelectric conversion portion side, the beam diameter is scattered without being converted.

The scattering amount depends on the position of the pixels of the area sensor and becomes larger as the pixel is more away from the central portions of the pixels.

For that reason, there arises such a problem that, in the peripheral portions of the pixels, the condensing rate of incident light is deteriorated, the scattering light arrives at the photoelectric conversion portion of the adjacent pixels, to thereby increase the mixture noise.

The deterioration in the condensing ratio and an increase in noise induce image deterioration.

SUMMARY OF THE INVENTION

The present invention has been made in view of the above-mentioned problem, and therefore it is an object of the present invention to provide a refractive index distributed optical element capable of deflecting an angle of incident light and converting a beam diameter, to thereby allow the light to exit, and an image sensor including the refractive index distributed optical element.

The present invention provides a refractive index distributed optical element having the following configuration, and an image sensor including the refractive index distributed optical element.

The refractive index distributed optical element according to the present invention has a refractive index varying within a plane, and includes; a positive refractive index distributed portion having a positive refractive index varying within the plane, and a negative refractive index distributed portion having a negative refractive index varying within the plane, in which absolute values of the refractive indexes of the positive refractive index distributed portion and the negative refractive index distributed portion vary so as to decrease toward a region between a region in which the positive refractive index distributed portion is formed and a region in which the negative refractive index distributed portion is formed.

Further, an image sensor according to the present invention includes; multiple pixels each including a photoelectric conversion portion that converts light into electricity, and the refractive index distributed optical element described above that is disposed on a light incident side of the photoelectric conversion portion of at least one of the multiple pixels.

According to the present invention, the refractive index distributed optical element capable of deflecting an angle of incident angle and converting a beam diameter to thereby allow the light to exit as well as the image sensor including the refractive index distributed optical element are realized.

Further features of the present invention will become apparent from the following description of exemplary embodiments with reference to the attached drawings.

BRIEF DESCRIPTION OF THE DRAWINGS

FIG. 9 is a cross-sectional view for describing the configuration of the image sensor according to the third embodiment of the present invention.

FIGS. 10A1, 10A2, and 10B1, 10B2, 10B3 and 10B4 are diagrams for describing prior art examples, respectively, in which FIGS. 10A1 and 10A2 are diagrams illustrating a configuration of a projector in the prior art, and FIGS. 10B1, 10B2, 10B3 and 10B4 are diagrams illustrating a configuration of an image sensor in the prior art.

DESCRIPTION OF THE EMBODIMENTS

A refractive index distributed optical element and a device using the refractive index distributed optical element according to embodiments of the present invention are described with reference to the accompanying drawings.

In all of the drawings for describing the embodiments, parts having the same function are denoted by identical symbols, and their repetitive description are omitted.

First Embodiment

A refractive index distributed optical element according to a first embodiment to which a constitution of a refractive index distributed optical element in which refractive index is varied within a plane according to the present invention is applied is described with reference to FIG. 1.

Figure 1:
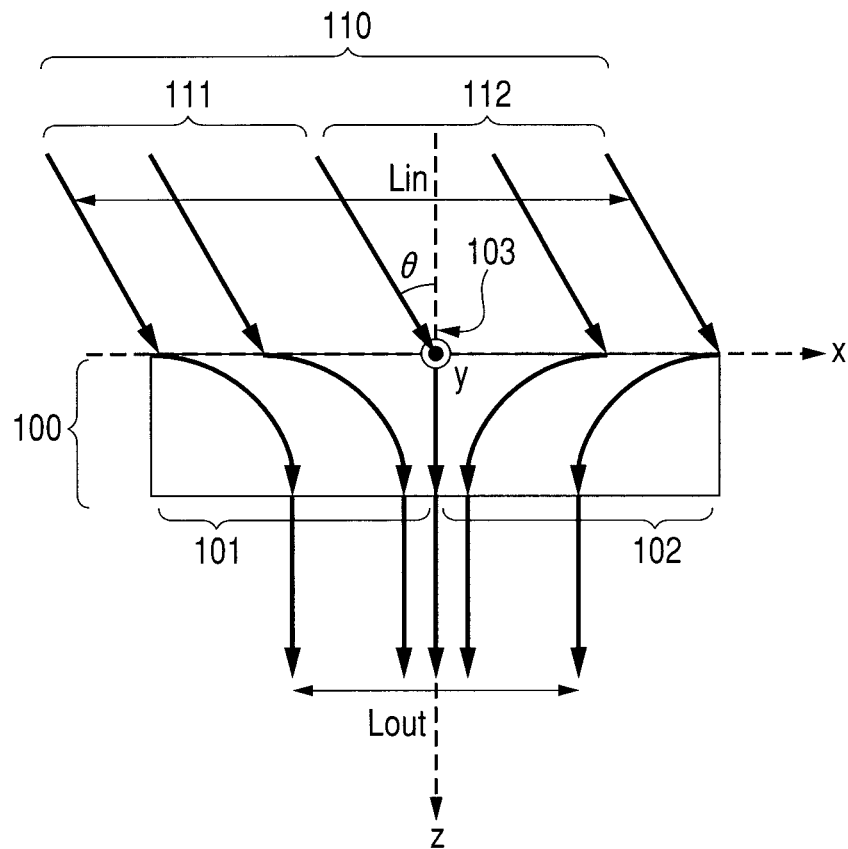
FIG. 1 is a cross-sectional view for describing a configuration of a refractive index distributed optical element according to a first embodiment of the present invention.

FIG. 1 illustrates the configuration in which an incident beam 110 enters from an incident side of a surface (z=0) of a refractive index distributed optical element 100 at an incident angle θ, and exited from an exit side of a rear surface. Coordinate axes are taken so that a surface normal line of the refractive index distributed optical element 100 is the z-axis, and an incident surface of light is the x-z plane.

The refractive index distributed optical element 100 includes a positive refractive index distributed portion 101 and a negative refractive index distributed portion 102.

Figure 2:
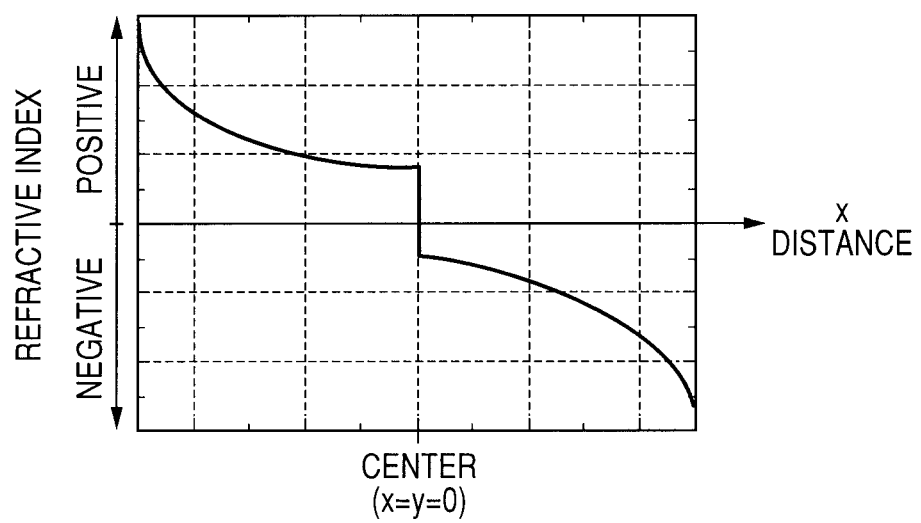
FIG. 2 is a diagram illustrating a refractive index distribution of the refractive index distributed optical element according to the first embodiment of the present invention.

FIG. 2 illustrates a variation in refractive index in an x-direction of the refractive index distributed optical element 100 according to this embodiment. The positive refractive index distributed portion 101 is such that the refractive index continuously and monotonously decreases toward a center axis 103 (x=y=0) of the refractive index distributed optical element 100.

On the other hand, the negative refractive index distributed portion 102 is such that the refractive index continuously and monotonously increases toward the center axis 103 of the refractive index distributed optical element 100 (the absolute value decreases).

The incident beam 110 entered into the refractive index distributed optical element 100 exits while satisfying the Snell's law.

That is, the incident beam 111 is refracted on a surface of the positive refractive index distributed portion 101 in the positive direction of the x-axis and propagates in the positive refractive index distributed portion 101.

Because an incident beam 111 in the positive refractive index distributed portion 101 propagates toward the low refractive index side (positive direction in the x-axis), the incident beam 111 propagates while being refracted so that the angle formed between the incident beam and the z-axis becomes small.

The absolute value of the refractive index in the positive direction of the x-axis is continuously decreased so that the incident beam 111 is gradually deflected so as to be parallel to the z-axis, and the incident beam 111 exits from the refractive index distributed optical element 100.

Further, the x-coordinate position of an exit end surface of the incident beam 111 is shifted toward the center axis 103 as compared with the x-coordinate position of an incident end surface (z=0).

On the other hand, an incident beam 112 is refracted on a surface of the negative refractive index distributed portion 102 in the negative direction of the x-axis and propagates in the negative refractive index distributed portion 102.

Because the incident beam 112 in the negative refractive index distributed portion 102 propagates toward refractive indexes with smaller absolute values (negative direction of the x-axis), the incident beam 112 propagates while being refracted so that the angle formed between the incident beam and the z-axis becomes small.

The absolute value of the refractive index in the negative direction of the x-axis is continuously decreased so that the incident beam 112 is gradually deflected so as to be parallel to the z-axis, and exits from the refractive index distributed optical element 100.

The x-coordinate position of the exit end surface of the incident beam 112 is shifted toward the center axis 103 as compared with the x-coordinate position of the incident end surface (z=0).

Hence, the beam obliquely entered to the refractive index distributed optical element 100 is deflected to the surface normal line side of the refractive index distributed optical element 100, the beam diameter Lout of the exit beam is converted to be smaller than the beam diameter Lin of the incident beam, and the beam exits from the refractive index distributed optical element 100.

The refractive index distributed optical element 100 also deflects a slope of an incident beam different in the incident angle θ so as to substantially be perpendicular and cause it to exit with a narrow beam diameter.

An example of a method for manufacturing a refractive index distributed optical element according to this embodiment is described below.

The positive refractive index distributed portion 101 and the negative refractive index distributed portion 102 may be formed by dispersing nanoparticles within a plane of a transparent material while varying the grain density and the grain diameter, to thereby control the refractive index.

Alternatively, a microstructure may be formed and laminated through an etching process to vary the refractive index.

Any other manufacturing methods may be used if the refractive index distribution may be formed.

Note that the negative refractive index material may be a left-handed metamaterial having a negative refractive index such as a split ring resonator, a ferromagnetic metal nanoparticle, or photonic crystal.

In this embodiment, the variation in the refractive indexes of the positive refractive index distributed portion 101 and the negative refractive index distributed portion 102 is monotonously varied, but does not always need to be monotonously varied.

Even in a configuration where a high refractive index material is inserted into the center axis side, the incident beam may be deflected, and the beam diameter may be converted.

When the high refractive index material is located on the center axis side, the beam propagation distance within the refractive index distributed optical element becomes longer, and a required film thickness is increased.

When the film thickness is reduced, the variation in the refractive index becomes large, and the reflection index becomes large. The reflection component causes a stray light such as scattering. For that reason, it is desirable that a variation in the refractive index is monotonously varied.

In this embodiment, the positive refractive index distributed portion 101 and the negative refractive index distributed portion 102 are formed in contact with each other on a plane including the center axis of the refractive index distributed optical element. However, those refractive index distributed portions 101 and 102 do not always need to be formed in contact with each other on the plane including the center axis. Even if those refractive index distributed portions 101 and 102 are not formed in contact with each other on the plane including the center axis, the incident beam is deflected so as to convert the beam diameter.

Because the beam exits from a the vicinity of the region where the positive refractive index distributed portion and the negative refractive index distributed portion are formed in contact with each other, the incident beam may exit from the vicinity of the center axis of the refractive index distributed optical element. For that reason, the exit beam may be easily aligned.

In order not to break a symmetric property of the beam, it is desirable that those refractive index distributed portions are formed in contact with each other on the plane including the center axis of the refractive index distributed optical element.

Second Embodiment

A refractive index distributed optical element in which the above-mentioned refractive indexes of the positive refractive index distributed portion and the negative refractive index portion are varied stepwise according to a second embodiment is described with reference to FIG. 3.

Figure 3:
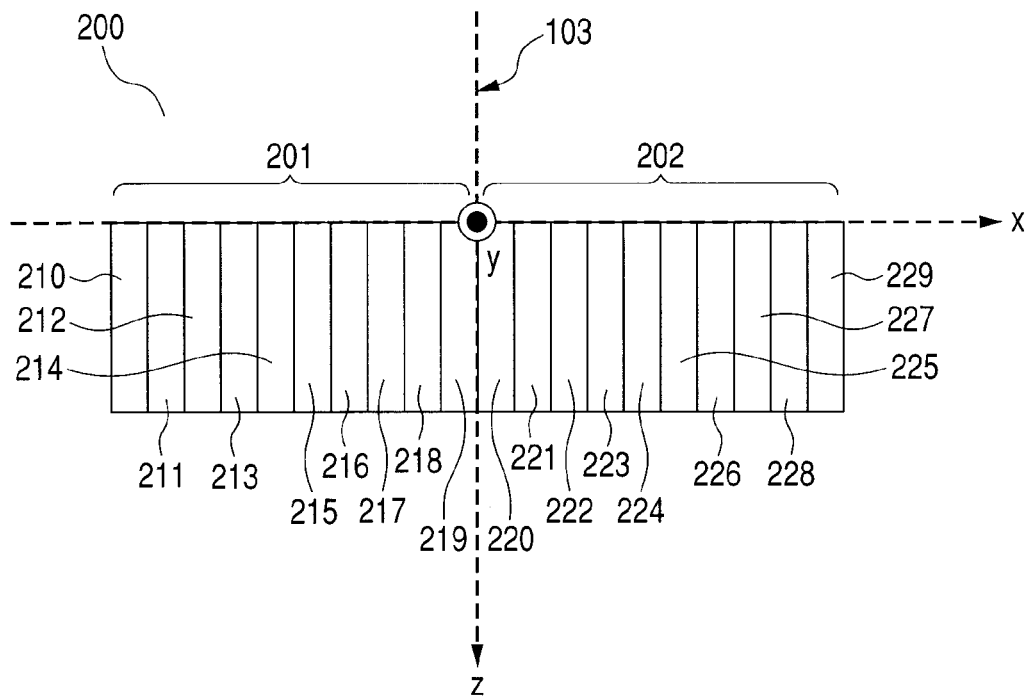
FIG. 3 is a cross-sectional view for describing a configuration of a refractive index distributed optical element according to a second embodiment of the present invention.

Referring to FIG. 3, a refractive index distributed optical element 200 includes a positive refractive index distributed portion 201, a negative refractive index distributed portion 202, plate portions 210 to 219, and plate portions 220 to 229.

The refractive index distributed optical element 200 according to this embodiment is different from that of the first embodiment in that the refractive indexes of the positive refractive index distributed portion 201 and the negative refractive index distributed portion 202 are stepwise and monotonously varied.

Figure 4A:
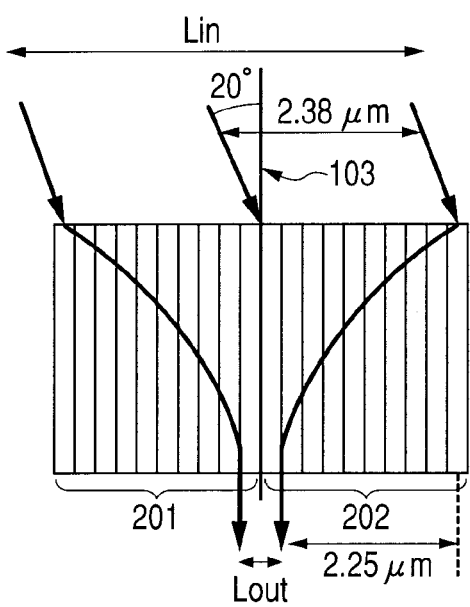
FIGS. 4A and 4B are diagrams illustrating results of a ray trace by the refractive index distributed optical element according to the second embodiment of the present invention.
Figure 4B:
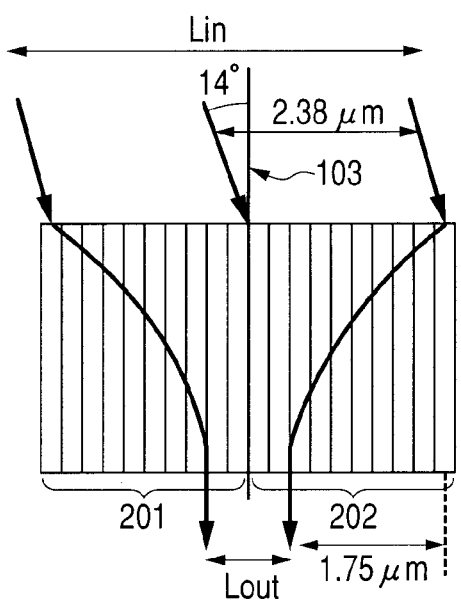

The results of the ray trace when the configuration of the refractive index distributed optical element 200 is, for example, of a square with 5.0 μm each side and 3.0 μm in thickness are illustrated in FIGS. 4A and 4B.

The positive refractive index distributed portion 201 includes the plate portions 210 to 219, and the negative refractive index distributed portion 202 includes the plate portions 220 to 229. Each of the plate portions is 5.0 μm long and 250 nm wide and 3.0 μm thick.

Figure 5:
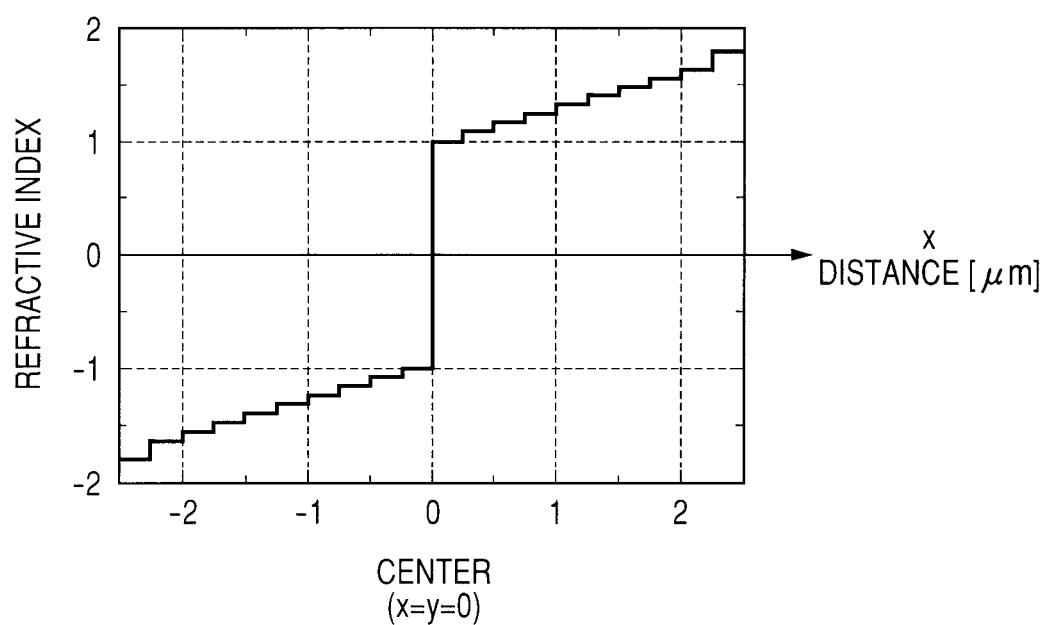
FIG. 5 is a diagram illustrating a variation in refractive index in an x-direction in the refractive index distributed optical element according to the second embodiment of the present invention.

The refractive indexes of the plate portions 210 to 229 are illustrated in Table 1. FIG. 5 illustrates a variation in refractive index in the x-direction of the refractive index distributed optical element 200.

TABLE 1

|  | Plate portion | Refractive index |
|---|---|---|
| Positive refractive index portion | 210 | 1.79 |
|  | 211 | 1.63 |
|  | 212 | 1.55 |
|  | 213 | 1.47 |
|  | 214 | 1.39 |
|  | 215 | 1.32 |
|  | 216 | 1.24 |
|  | 217 | 1.16 |
|  | 218 | 1.08 |

TABLE 1-continued

|  | Plate portion | Refractive index |
| --- | --- | --- |
|  | 219 | 1.00 |
| Negative | 220 | −1.00 |
| refractive | 221 | −1.08 |
| index | 222 | −1.16 |
| portion | 223 | −1.24 |
|  | 224 | −1.32 |
|  | 225 | −1.39 |
|  | 226 | −1.47 |
|  | 227 | −1.55 |
|  | 228 | −1.63 |
|  | 229 | −1.79 |

As illustrated in FIG. 4A, the beam entered at a position apart from the center axis 103 of the refractive index distributed optical element 200 by 2.38 μm at an incident angle 20 degrees is shifted to the center axis side of the refractive index distributed optical element 200 by 2.13 μm, and exits at an angle of 0.36 degrees.

That is, the beam diameter Lin of the incident beam which is 4.5 μm is converted into the beam diameter Lout of the exit beam which is 0.75 μm.

The absolute values of the refractive indexes of the positive refractive index distributed portion 201 and the negative refractive index distributed portion 202 are decreased toward the center axis of the refractive index distributed optical element so that a beam obliquely incident to the refractive index distributed optical element 200 can be deflected in a direction perpendicular to the plane with the beam diameter converted into a narrow beam diameter to be caused to exit.

As illustrated in FIG. 4B, the beam entered at a position apart from the center axis 103 of the refractive index distributed optical element 200 by 2.38 μm at an incident angle 14 degrees is shifted to the center axis side of the refractive index distributed optical element 200 by 1.63 μm, and exits at an angle of 0.10 degrees.

For a beam entering at a different angle, such an obliquely incident beam can also be deflected in a perpendicular direction to the plane with the beam diameter converted into a narrower beam diameter to be caused to exit.

Figure 6A:
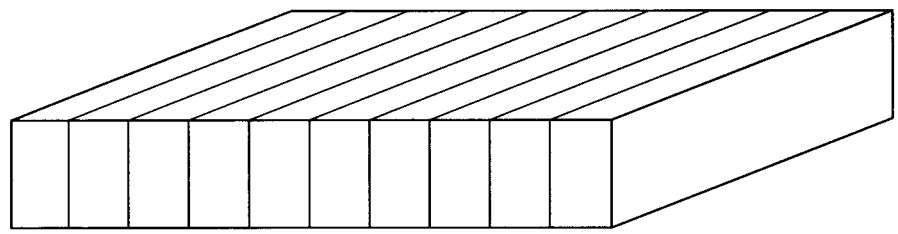
FIGS. 6A, 6B and 6C are diagrams for describing a case in which the refractive index is varied linearly, obliquely, and concentrically, respectively, in the refractive index distributed optical element according to the second embodiment of the present invention.
Figure 6B:
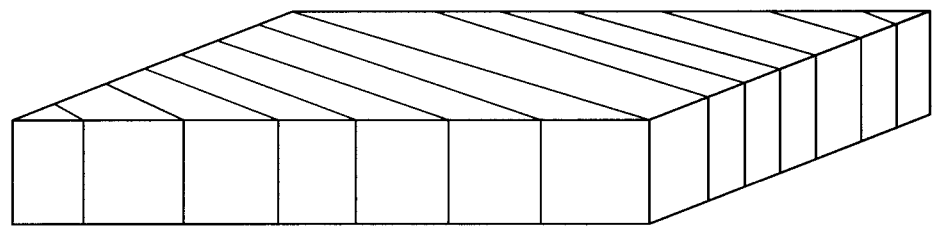
Figure 6C:
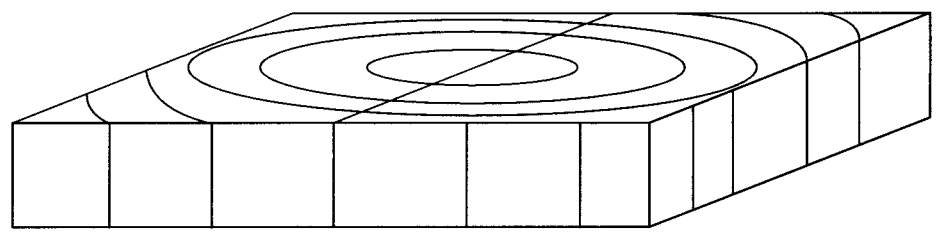

In this embodiment, the refractive index is varied linearly in parallel to one side of the refractive index distributed optical element (FIG. 6A). However, the variation in the refractive index may be made not in parallel but obliquely (FIG. 6B), and not linearly but concentrically (FIG. 6C).

Further, if the absolute value of the refractive index is smaller as is closer to the center axis of the refractive index distributed optical element, and the positive and negative refractive indexes are varied within the plane, the refractive index may be varied in any other manners. This is not limited to this embodiment in which the refractive index is stepwise varied.

Third Embodiment

A configuration example in which a refractive index distributed optical element is applied to an image sensor according to a third embodiment of the present invention is described below.

In this embodiment, in an image sensor in which multiple pixels each having a photoelectric conversion portion for converting light into electricity are arranged, the refractive index distributed optical element is applied to the incident side of the photoelectric conversion portion.

Figure 7:
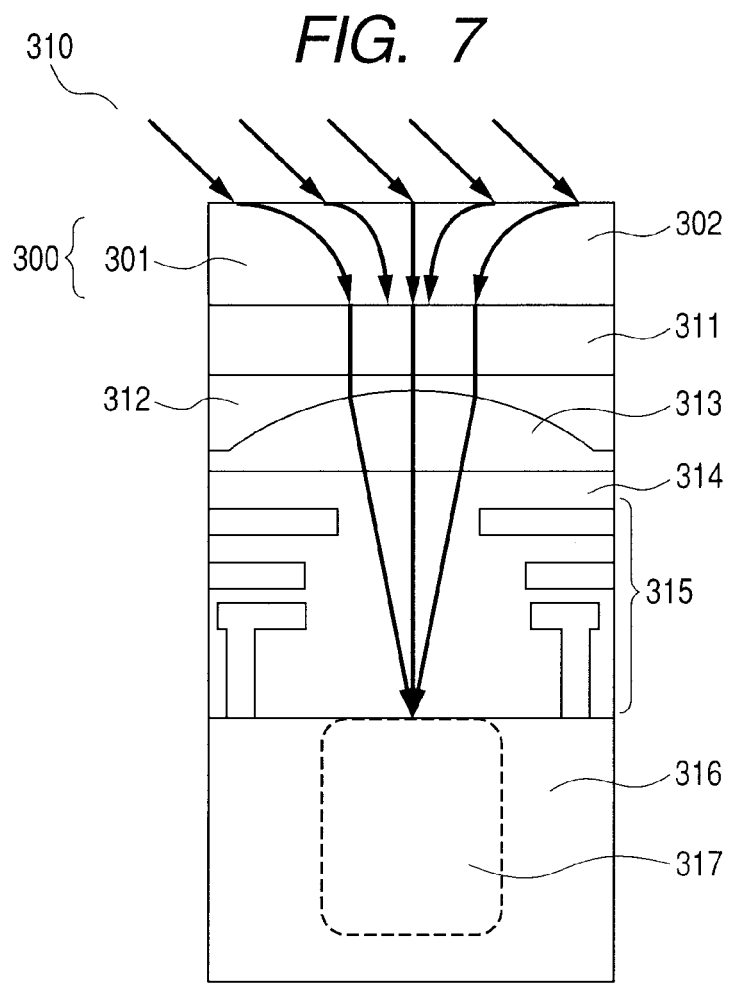
FIG. 7 is a cross-sectional view for describing a configuration of an image sensor according to a third embodiment of the present invention.

In FIG. 7, a refractive index distributed optical element according to the present invention is represented by 300, an incident light is represented by 310, a color filter is represented by 311, a flattening layer is represented by 312, an inner-layer lens is represented by 313, an inter-layer insulating film is represented by 314, a wiring layer or a light shielding film is represented by 315, and a semiconductor region including an photoelectric conversion portion 317 is represented by 316.

The refractive index distributed optical element 300 illustrated in FIG. 7 is configured so that the positive refractive index distributed portion 301 is arranged on the side of the central portions of the pixels of the image sensor and the negative refractive index distributed portion 302 is arranged on the opposite side thereto.

In the case of the area sensor in which the multiple image sensors are two-dimensionally arranged, because the distance between the exit pupil of the camera lens and the area sensor is a finite length, a primary light obliquely enters to image sensors of the peripheral portions of the pixels.

For example, when the pixel size is 5 μm×5 μm, the size of the area sensor is APS-C (16.7 mm×23.4 mm), and the distance to the exit pupil is 40 mm, the primary light with a slope of 20 degrees at the maximum enters to the image sensors of the peripheral elements.

When the refractive index distributed optical element 200 according to the second embodiment is used for the refractive index distributed optical element 300, an incident light with a beam diameter of 4.76 μm is caused to exit from the refractive index distributed optical element 300 with the beam diameter of 0.75 μm.

Further, an incident light of an incident angle of 20 degrees is deflected toward the photoelectric conversion portion and exits. For that reason, because the incident light is guided into the photoelectric conversion portion without being scattered by the wiring layer or the light shielding film, the use efficiency of light is improved.

Figure 8:
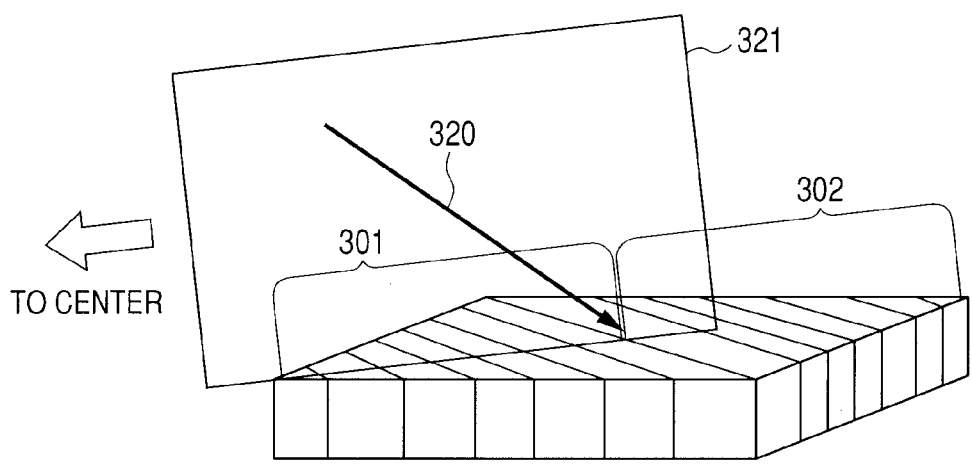
FIG. 8 is a diagram for describing a refractive index distributed optical element constituting the image sensor according to the third embodiment of the present invention.

As illustrated in FIG. 8, because the center of the exit pupil coincides with the center of the image sensor in general, an incident plane 321 of a primary beam 320 is a plane including the center of the image sensors and the incident position of the pixels. For that reason, it is desirable that the positive refractive index distributed portion 301 is arranged on the side of the central portions of the pixels of the image sensor, and the negative refractive index distributed portion 302 is arranged on the opposite side thereto.

In the third embodiment, although the center axis of the refractive index distributed optical axis coincides with the center axis of the photoelectric conversion portion, such coincidence is not always necessary.

Even though the center axis of the refractive index distributed optical element does not coincide with the center axis of the photoelectric conversion portion, because the beam diameter of the incident light can be narrowed, scattering due to the wiring layer or the light shielding film can be reduced.

For that reason, the mixture noise to the adjacent pixels can be reduced. However, it is desirable that the center axis of the refractive index distributed optical element coincides with the center axis of the photoelectric conversion portion, because an incident light can be efficiently entered to the photoelectric conversion portion, and the light usage efficiency is improved.

In this embodiment, the inner-layer lens is disposed as a condensing portion between the refractive index distributed optical element and the photoelectric conversion portion, but the condensing portion is not always required.

As illustrated in FIG. 9, even if no condensing portion is provided, the incident light is deflected to the photoelectric conversion portion side so that the beam diameter can be narrowed and scattering by the wiring layer or the light shielding film can be reduced.

For that reason, the mixture noise to the adjacent pixels can be reduced. The provision of the condensing portion is however desirable, because the beam can be further efficiently condensed to the photoelectric conversion portion, and the light usage efficiency is improved.

The condensing portion may be configured by not only the inner-layer lens, but also a member having a function of guiding the light to the photoelectric conversion portion such as a microlens, a refractive index distributed lens, or a Fresnel lens.

The embodiment of the image sensor using the refractive index distributed optical element of the present invention has been described above. The present invention is not limited to the image sensor but may be applied to a projector and other various modifications.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-090664, filed on Apr. 3, 2009, which is hereby incorporated by reference herein in its entirety.

What is claimed is:

1. A refractive index distributed optical element having a refractive index varying within a plane, comprising:
a positive refractive index distributed portion having a positive refractive index varying within the plane; and
a negative refractive index distributed portion having a negative refractive index varying within the plane,
wherein absolute values of the refractive indexes of the positive refractive index distributed portion and the negative refractive index distributed portion decrease toward a region between the positive refractive index distributed portion and the negative refractive index distributed portion.

2. A refractive index distributed optical element according to claim 1, wherein the refractive index in the positive refractive index distributed portion and the refractive index in the negative refractive index distributed portion monotonously vary continuously or stepwise.

3. A refractive index distributed optical element according to claim 1, wherein the positive refractive index distributed portion and the negative refractive index distributed portion are in contact with each other on a plane including a center axis within the plane in the refractive index distributed optical element.

4. An image sensor, comprising:
multiple pixels each including an photoelectric conversion portion that converts light into electricity; and
the refractive index distributed optical element according to claim 1 that is disposed on an optical incident side of the photoelectric conversion portion of at least one of the multiple pixels.

5. An image sensor according to claim 4, wherein the at least one of the multiple pixels is of peripheral portions of the pixels of the image sensor, and wherein the positive refractive distributed portion of the refractive index distributed optical element is arranged on a side of central portions of the pixels of the image sensor and the negative refractive index distributed portion is arranged on an opposite side thereto.

6. An image sensor according to claim 4, wherein the refractive index distributed optical element has a center axis within the plane that coincides with a center axis of the photoelectric conversion portion.

7. An image sensor according to claim 4, further comprising a condensing portion for condensing light disposed between the refractive index distributed optical element and the photoelectric conversion portion.

8. An image sensor according to claim 4, wherein the plane is perpendicular to a center axis of the photoelectric conversion portion.

9. A refractive index distributed optical element having a refractive index varying within a plane, comprising:
a positive refractive index distributed portion having a positive refractive index varying within the plane; and
a negative refractive index distributed portion having a negative refractive index varying within the plane,
wherein absolute values of the refractive indexes of the positive refractive index distributed portion decreases toward the negative refractive index distributed portion and absolute values of the refractive indexes of the negative refractive index distributed portion decreases toward the positive refractive index distributed portion.

* * * * *